United States Patent
Ootsuki et al.

(10) Patent No.: US 11,282,643 B2
(45) Date of Patent: Mar. 22, 2022

(54) COMPOSITE STRUCTURE, FIRED BODY HAVING COMPOSITE STRUCTURE, POWDER INCLUDING PARTICLE HAVING COMPOSITE STRUCTURE, AND DIELECTRIC ELEMENT INCLUDING DIELECTRIC HAVING COMPOSITE STRUCTURE

(71) Applicant: TDK CORPORATION, Tokyo (JP)

(72) Inventors: Shirou Ootsuki, Tokyo (JP); Masahito Furukawa, Tokyo (JP); Satoshi Wada, Kofu (JP); Shintaro Ueno, Kofu (JP); Yuya Hattori, Kofu (JP)

(73) Assignee: TDK CORPORATION, Tokyo (JP)

( * ) Notice: Subject to any disclaimer, the term of this patent is extended or adjusted under 35 U.S.C. 154(b) by 253 days.

(21) Appl. No.: 16/295,590

(22) Filed: Mar. 7, 2019

(65) Prior Publication Data
US 2019/0279818 A1 Sep. 12, 2019

(30) Foreign Application Priority Data
Mar. 8, 2018 (JP) .............................. JP2018-042406

(51) Int. Cl.
*H01G 4/12* (2006.01)
*H01G 4/30* (2006.01)
(Continued)

(52) U.S. Cl.
CPC ......... *H01G 4/1281* (2013.01); *B28B 11/243* (2013.01); *C01G 23/00* (2013.01); *C04B 35/01* (2013.01); *C04B 35/016* (2013.01); *C04B 35/117* (2013.01); *C04B 35/457* (2013.01); *C04B 35/462* (2013.01); *C04B 35/4682* (2013.01); *C04B 35/4686* (2013.01); *C04B 35/47* (2013.01); *C04B 35/475* (2013.01); *C04B 35/495* (2013.01); *C04B 35/62685* (2013.01); *C04B 35/638* (2013.01); *C04B 35/6342* (2013.01); *C04B 35/64* (2013.01);
(Continued)

(58) Field of Classification Search
None
See application file for complete search history.

(56) References Cited

U.S. PATENT DOCUMENTS

| | | | |
|---|---|---|---|
| 6,777,248 B1 | 8/2004 | Nabatame et al. | |
| 2007/0207587 A1* | 9/2007 | Kim ....................... | H01L 28/65 438/393 |

(Continued)

FOREIGN PATENT DOCUMENTS

| | | |
|---|---|---|
| JP | H06-163310 A | 6/1994 |
| JP | 2011-187674 A | 9/2011 |

(Continued)

OTHER PUBLICATIONS

English Abstract of Jo et al. (JP 2000-226216) (Year: 2000).*

*Primary Examiner* — Ronak C Patel
(74) *Attorney, Agent, or Firm* — Oliff PLC

(57) ABSTRACT

A composite structure including a conductor region that is configured from a first oxide, and an insulator region that is configured from a second oxide and that surrounds the conductor region, wherein the first oxide and the second oxide are in hetero structure with each other. A powder and a fired body each having such a composite structure are also preferable.

8 Claims, 7 Drawing Sheets

(51) Int. Cl.

| | |
|---|---|
| *B28B 11/24* | (2006.01) |
| *C23C 14/18* | (2006.01) |
| *C04B 35/117* | (2006.01) |
| *C04B 35/495* | (2006.01) |
| *C04B 35/47* | (2006.01) |
| *C04B 35/468* | (2006.01) |
| *C04B 35/457* | (2006.01) |
| *C04B 35/475* | (2006.01) |
| *C04B 35/634* | (2006.01) |
| *C04B 35/638* | (2006.01) |
| *C04B 35/64* | (2006.01) |
| *C04B 35/01* | (2006.01) |
| *C01G 23/00* | (2006.01) |
| *C04B 35/462* | (2006.01) |
| *C04B 35/626* | (2006.01) |
| *H01G 4/232* | (2006.01) |
| *H01G 4/248* | (2006.01) |

(52) U.S. Cl.
CPC .............. *C23C 14/18* (2013.01); *H01G 4/30* (2013.01); *C04B 2235/3201* (2013.01); *C04B 2235/3213* (2013.01); *C04B 2235/3215* (2013.01); *C04B 2235/3217* (2013.01); *C04B 2235/3227* (2013.01); *C04B 2235/3234* (2013.01); *C04B 2235/3236* (2013.01); *C04B 2235/3251* (2013.01); *C04B 2235/3255* (2013.01); *C04B 2235/3268* (2013.01); *C04B 2235/3275* (2013.01); *C04B 2235/3279* (2013.01); *C04B 2235/3289* (2013.01); *C04B 2235/3293* (2013.01); *C04B 2235/3298* (2013.01); *C04B 2235/5445* (2013.01); *C04B 2235/5454* (2013.01); *C04B 2235/604* (2013.01); *C04B 2235/656* (2013.01); *C04B 2235/768* (2013.01); *C04B 2235/79* (2013.01); *C04B 2235/85* (2013.01); *C04B 2235/96* (2013.01); *H01G 4/232* (2013.01); *H01G 4/248* (2013.01)

(56) References Cited

U.S. PATENT DOCUMENTS

| | | | |
|---|---|---|---|
| 2013/0258545 A1* | 10/2013 | Yano | H01G 4/33 361/301.4 |
| 2016/0039721 A1 | 2/2016 | Fujimoto | |
| 2016/0185670 A1 | 6/2016 | Fujimoto | |

FOREIGN PATENT DOCUMENTS

| | | |
|---|---|---|
| JP | 2016-037439 A | 3/2016 |
| WO | 99-25014 A1 | 5/1999 |

* cited by examiner

COMPOSITE STRUCTURE, FIRED BODY HAVING COMPOSITE STRUCTURE, POWDER INCLUDING PARTICLE HAVING COMPOSITE STRUCTURE, AND DIELECTRIC ELEMENT INCLUDING DIELECTRIC HAVING COMPOSITE STRUCTURE

BACKGROUND OF THE INVENTION

Field of the Invention

The present invention relates to a composite structure, a fired body having a composite structure, a powder including a particle having a composite structure, and a dielectric element including a dielectric having a composite structure.

Description of the Related Art

As electronic equipment is reduced in size and increased in functionality, capacitors small in size and high in capacitance, such as multilayer ceramic capacitors, have been progressively developed. Ceramic capacitors are excellent in output density because no chemical reaction is interposed in the course of energy storage. On the other hand, such ceramic capacitors are low in storable energy, and thus a ceramic capacitor having a high capacitance can be developed to thereby allow for applications to not only electronic components, but also energy storage devices and the like.

Examples of materials for realizing an increase in capacitance include conductor/insulator composite materials which are important candidates because of their excellent dielectric properties. Specifically, various composite materials such as a metal/dielectric combination, a metal/polymer combination and a semiconductor/dielectric combination have been heretofore studied, and dielectric properties thereof have been reported. A known semiconductor/dielectric combination is a grain boundary insulation-type semiconductor capacitor.

One approach for increasing the capacitance of a capacitor by use of such a composite material is to reduce the proportion of insulators to conductors. A capacitor, however, with a conductor/insulator composite material, which is reduced in the proportion of insulators, has the problem of being decreased in the distance between conductors to result in deterioration in dielectric breakdown strength property of the capacitor.

For example, Japanese Patent Laid-Open No. 6-163310 describes a grain boundary insulation-type semiconductor capacitor including $(Ca,Sr)TiO_3$ as a main component, in which the composition of the semiconductor capacitor can be controlled to result in enhancements in apparent dielectric constant and dielectric breakdown strength. There, however, is not any sample having a dielectric breakdown strength of more than 1000 V/mm, while the sample has a high apparent dielectric constant of 100000 or more, and thus dielectric breakdown strength property is insufficient.

As described above, electrostatic capacitance property and dielectric breakdown strength property are incompatible with each other, and a capacitor with a conductor/insulator composite material has the problem of having difficulty in satisfying both such properties.

The present invention has been made in view of such circumstances, and an object thereof is to allow for enhancements in apparent dielectric constant and dielectric breakdown strength properties of a dielectric having a conductor/insulator composite structure.

SUMMARY OF THE INVENTION

The present invention provides the following in order to achieve the above object.

[1] A composite structure comprising a conductor region that is configured from a first oxide and an insulator region that is configured from a second oxide and that surrounds the conductor region, wherein
hetero structure of the first oxide and the second oxide is formed.

[2] The composite structure according to [1], wherein the first oxide and the second oxide have a perovskite structure.

[3] The composite structure according to [1], wherein the first oxide is one or more oxides selected from an oxide comprising La and Ni and an oxide comprising Sr and Ru, and the second oxide is an oxide comprising Ti and one or more elements selected from Ba and Sr.

[4] The composite structure according to [2], wherein the first oxide is $LaNiO_3$ and/or $SrRuO_3$, and the second oxide is one or more selected from $(Ba,Sr)TiO_3$, $(Bi_{0.5}Na_{0.5})TiO_3$ and $(Bi_{0.5}K_{0.5})TiO_3$.

[5] A fired body comprising the composite structure according to any of [1] to [4].

[6] A powder comprising a particle having the composite structure according to any of [1] to [4].

[7] A dielectric element comprising a dielectric having the composite structure according to any of [1] to [4].

According to the present invention, a dielectric having a conductor/insulator composite structure can be enhanced in apparent dielectric constant and dielectric breakdown strength properties.

DETAILED DESCRIPTION OF THE PREFERRED EMBODIMENTS

Hereinafter, the present invention will be described in detail in the following order based on a specific embodiment.
1. Dielectric element
   1.1. Entire configuration of monolayer capacitor
   1.2. Dielectric
      1.2.1. Composite structure 2. Method for producing dielectric element
  2.1. Powder including particle having composite structure
  2.2. Fired body having composite structure
3. Effects in the present embodiment
4. Modified example (1. Dielectric Element)

First, a monolayer capacitor will be described as one example of a dielectric element according to the present embodiment.

(1.1. Entire Configuration of Monolayer Capacitor)

Figure 1:
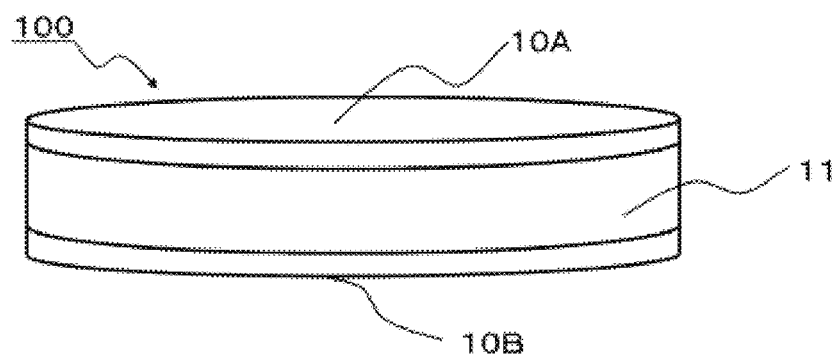
FIG. 1 illustrates a perspective view of a monolayer capacitor as one example of a dielectric element according to the present embodiment.

As illustrated in FIG. 1, a monolayer capacitor 100 according to the present embodiment includes a plate-like dielectric 11, and a pair of electrodes 10A and 10B formed on a pair of opposite surfaces that correspond to both main surfaces of the dielectric 11. The dielectric 11 and the pair of electrodes 10A and 10B form a capacitor part, and the pair of electrodes 10A and 10B can be connected to an external circuit to be applied voltage, thereby allowing the dielectric 11 to exhibit a predetermined electrostatic capacitance and thus exert the function as a capacitor.

The conductive material contained in the electrodes 10A and 10B is not particularly limited and can be arbitrarily set depending on desired properties, the intended use and the like. In the present embodiment, examples include silver (Ag), gold (Au), copper (Cu), platinum (Pt) and nickel (Ni).

While the dielectric 11 has a cylindrical shape in FIG. 1, the shape of the dielectric 11 is not particularly limited and can be arbitrarily set depending on desired properties, the intended use and the like. The dimension of the dielectric 11 is also not particularly limited and can be arbitrarily set depending on desired properties, the intended use and the like.

(1.2. Dielectric)

In the present embodiment, the dielectric 11 has a conductor/insulator composite structure. Such a composite structure has a large number of conductors connected via insulators and thus an equivalent circuit is formed where insulators, namely, dielectrics are connected serially and in parallel. An insulator exhibiting dielectric properties is thin and the area of a conductor serving as an electrode in contact with the insulator is large, thereby resulting in a very high apparent dielectric constant calculated from the electrostatic capacitance. Hereinafter, a composite structure according to the present embodiment will be described in detail.

(1.2.1. Composite Structure)

Figure 2:
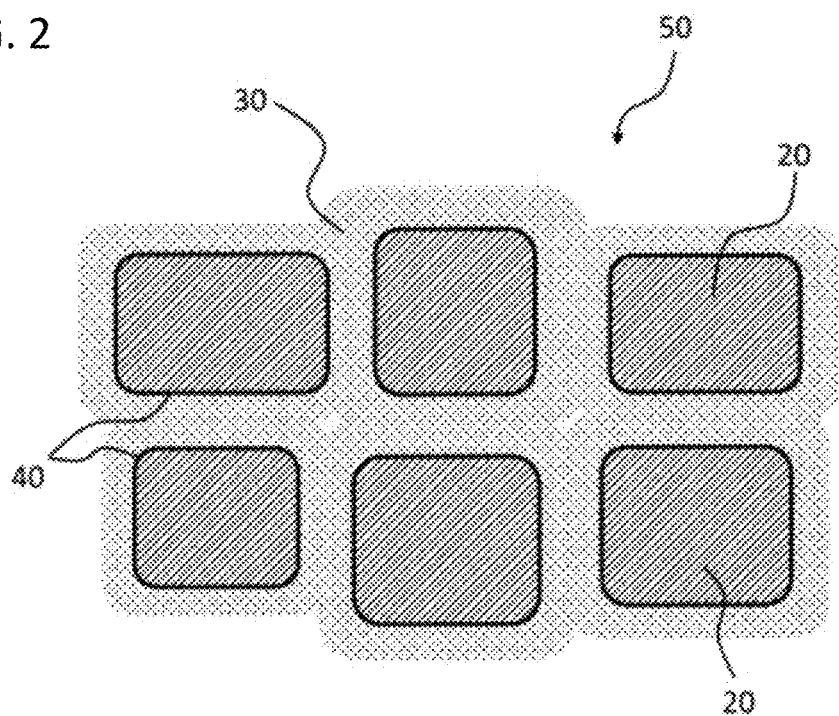
FIG. 2 illustrates a schematic cross-sectional view of a composite structure according to the present embodiment.

A composite structure 50 is a structure including a conductor region 20 and an insulator region 30 surrounding the conductor region 20, as illustrated in FIG. 2. One conductor region 20 is constituted from one conductor particle and multiple conductor particles are bound via a grain boundary area constituting the insulator region 30 in the composite structure in FIG. 2. That is, a relationship between the conductor region 20 and the insulator region 30 in FIG. 2 corresponds to a relationship between a semiconductor particle and a grain boundary phase in a grain boundary insulation-type semiconductor capacitor.

The conductor region 20 is a crystalline region that is constituted from a first oxide and that has an electrical resistivity of $1\times10^{-2}$ $\Omega \cdot m$ or less. The conductor region 20 is preferably a region having an electrical resistivity of $1\times10^{-4}$ $\Omega \cdot m$ or less. The insulator region 30 is a crystalline region that is constituted from a second oxide and that has an electrical resistivity of $1\times10^{4}$ $\Omega \cdot m$ or more. The insulator region 30 preferably has an electrical resistivity of $1\times10^{6}$ $\Omega \cdot m$ or more, more preferably $1\times10^{8}$ $\Omega \cdot m$ or more. That is, both the conductor region 20 and the insulator region 30 contain an oxide as a main component in the present embodiment.

In the present embodiment, the first oxide constituting the conductor region 20 and the second oxide constituting the insulator region 30 generate hetero structure. The "hetero structure" means that the first oxide and the second oxide different in composition from each other are bonded on any crystal surface without any changes in respective crystal structures. In other words, the respective crystal structures are bound with lattice match.

Such hetero structure occurs at interface 40 between the conductor region 20 and the insulator region 30 illustrated in FIG. 2. One surface of the interface 40 corresponds to an end of the crystal structure of the first oxide and other surface of the interface 40 corresponds to an end of the crystal structure of the second oxide. The end of the first oxide and the end of the second oxide are continuously bound around the interface 40. Both the crystal structures are here mutually slightly strained in order that the first oxide and the second oxide different in crystal lattice spacing are bound with maintaining crystal lattice match. Accordingly, a hetero structure portion can be said to be a structure gradient region with a continuous change from one (for example, first oxide) crystal structure to other (for example, second oxide) crystal structure.

It is considered that such a structure gradient region has an effect on dielectric properties exhibited by the insulator region 30 to result in an enhancement in apparent dielectric constant of a dielectric having the composite structure. It is further considered that hetero structure between the conductor region 20 and the insulator region 30 decreases defects present in the insulator region 30. As a result, any conduction (short-circuiting) between adjacent conductor regions, caused through such defects, can be suppressed. Accordingly, dielectric breakdown strength property of the dielectric having the composite structure can be enhanced regardless of a small thickness of the insulator region 30.

In the present embodiment, the insulator region 30 preferably has a thickness of 1/10 or less of the diameter of the conductor region 20. From a viewpoint of sufficiently obtaining the effect of hetero structure, when a thickness of the insulator region 30 is too large, the structure gradient region formed by hetero structure become small, not resulting in the above effect. The diameter of the conductor region 20 is here defined as the average value of the longest size (major axis) and the shortest size (minor axis) of the conductor region 20.

The insulator region 30 desirably has a thickness of 1 nm or more. When a thickness of the insulator region 30 is too small, a periphery portion of the conductor region 20 which is not covered with the insulator region 30 tends to be easily generated. As a result, insulation properties tend to deteriorate and to degrade dielectric breakdown strength property of the dielectric having the composite structure.

In the present embodiment, both the first oxide and the second oxide preferably have a perovskite structure. When the oxide constituting the conductor region and the oxide constituting the insulator region can have the same crystal structure, hetero structure of the first oxide and the second oxide at the interface between the conductor region and the insulator region easily generates, thereby allowing the structure gradient region to be sufficiently formed, to result in enhancements in dielectric breakdown strength property.

The first oxide having a perovskite structure is preferably any one of or both $LaNiO_3$ and $SrRuO_3$.

The second oxide having a perovskite structure is preferably one or more selected from $(Ba,Sr)TiO_3$, $(Bi_{0.5}Na_{0.5})TiO_3$ and $(Bi_{0.5}K_{0.5})TiO_3$.

Here, $(Ba,Sr)TiO_3$ indicates that any one of or both Ba and Sr correspond(s) to element(s) occupying the A site of a perovskite structure and Ba and Sr occupy the A site in any proportion. Accordingly, in the case where $(Ba,Sr)TiO_3$ represents $(Ba_xSr_{1-x})TiO_3$, x satisfies $0 \leq x \leq 1$.

A case is also preferable where both the first oxide and the second oxide have no perovskite structure. In such a case, the first oxide is preferably one or more oxides selected from an oxide including La and Ni and an oxide including Sr and Ru. Moreover, the second oxide is preferably an oxide including Ti and one or more elements selected from Ba and Sr. A composite structure constituted by such a combination enables the apparent dielectric constant of the dielectric to be enhanced.

The conductor region 20 may also include trace amounts of impurities, accessory component(s), and the like other than the first oxide as a main component as long as the effect of the present invention is obtained. In the present embodiment, the main component is preferably contained in an amount of 80 mol % or more and 100 mol % or less in the entire conductor region 20. Examples of any component(s) other than the main component, namely, any component(s) not constituting any oxide having hetero structure, include Ca and Si.

The insulator region 30 may also include trace amounts of impurities, accessory component(s), and the like other than the second oxide as a main component as long as the effect of the present invention is obtained. In the present embodiment, the main component is preferably contained in an amount of 80 mol % or more and 100 mol % or less in the entire insulator region 30. Examples of any component(s) other than the main component, namely, any component not constituting any oxide having hetero structure, include Ca and Si.

The method for confirming hetero structure between the first oxide and the second oxide in the above composite structure is not particularly limited as long as such a method can evaluate lattice match of both the respective crystal structures at the interface between the first oxide and the second oxide.

In the present embodiment, the dielectric included in the monolayer capacitor is subjected to microsampling with a focused ion beam (FIB) to produce a thin sample having the composite structure, and the sample is evaluated with a transmission electron microscope (TEM). Specifically, the thin sample is observed with TEM to provide a TEM image. The obtained TEM image can be used to confirm the form of a particle constituting the composite structure. The conductor region and the insulator region can also be identified by STEM-EDS analysis with an energy dispersive X-ray spectrometry (EDS) apparatus attached to a scanning transmission electron microscope (STEM). Furthermore, a high-resolution TEM image can be used to evaluate lattice match of both the respective crystal structures at the interface between the first oxide and the second oxide, and it can be thus confirmed whether or not the first oxide and the second oxide generate hetero structure.

(2. Method for Producing Dielectric Element)

Next, one example of the method for producing the monolayer capacitor 100 illustrated in FIG. 1 will be described below as one example of a method for producing a dielectric element.

In the present embodiment, first, a powder including a particle having the composite structure with hetero structure formed is produced, the powder is formed into a green compact, and the green compact is fired to thereby obtain a fired body. The obtained fired body has a predetermined shape where such particles having the composite structure with hetero structure formed are mutually connected. The fired body can be subjected to formation of electrodes thereon, thereby producing a monolayer capacitor. Hereinafter, the production method will be described in detail.

(2.1. Method for Producing Powder Including Particle Having Composite Structure)

First, prepared is a powder including a conductor particle for formation of a conductor region. Such a powder that can be used is a powder of the first oxide.

Next, the conductor particle is covered with an insulator to form hetero structure. The method for covering with the insulator is not particularly limited as long as such a method can form hetero structure. Examples include a sol gel method, an oxalate method and a hydrothermal synthesis method. The raw material of the insulator for covering may be the second oxide or a compound to be converted into the second oxide after covering. Examples of the compound to be converted into the second oxide after covering include carbonate, nitrate, hydroxide and oxide.

The present embodiment describes a method for covering the conductor particle with the insulator by use of a hydrothermal synthesis method. Such a hydrothermal synthesis method includes dispersing a powder including the conductor particle, in a solvent to which the second oxide or the compound to be converted into the second oxide after covering is added, and performing a synthesis treatment under a high temperature and a high pressure. Thus, a powder can be obtained which includes a particle having a composite structure where the conductor particle is covered with the insulator. Here, the amount of the raw material of the insulator in the solvent, the synthesis temperature, the synthesis time, and the like can be controlled to thereby provide a powder including a particle having a composite structure where the insulator forms hetero structure with the conductor particle and is grown. Accordingly, one conductor region is present in one particle in the present embodiment.

(2.2. Method for Producing Fired Body Having Composite Structure)

Subsequently, the obtained powder is mixed by use of a ball mill or the like. The mixing method may be conducted by wet mixing or dry mixing. In the case of wet mixing, a slurry after mixing is dried. The dispersion medium during the mixing is not particularly limited, and for example, water can be used.

The method for molding the powder mixed is not particularly limited and may be appropriately selected depending on the desired shape and dimension, and the like. In the case of press molding, a predetermined binder and, if necessary, an additive is added to the powder mixed and the resultant is molded to a predetermined shape to obtain a green compact. Alternatively, a predetermined binder and the like may be added to the powder mixed and the resultant may be granulated to thereby obtain a granulated powder, and the granulated powder may be used to obtain a green compact.

The obtained green compact is, if necessary, subjected to a binder removal treatment and is then fired to thereby obtain the fired body having the above composite structure. The firing conditions here are not particularly limited as long as hetero structure is kept after the firing, and the holding temperature is preferably 800 to 1100° C. and the firing atmosphere is preferably in the air. The obtained fired body here may be a dense fired body (sintered body) with few interparticle voids or may be a fired body with relatively many interparticle voids.

The obtained fired body is, if necessary, polished and both main surfaces thereof are coated with an electrode paste and burned to form an electrode. The method for forming such an electrode is not particularly limited and such an electrode may be formed by vapor deposition, sputtering, or the like.

The above process can be accomplished to thereby provide the monolayer capacitor illustrated in FIG. 1.

(3. Effects in the Present Embodiment)

In the present embodiment, the conductor (first oxide) and the insulator (second oxide) generate hetero structure at the interface therebetween in the conductor/insulator composite structure. It is considered that hetero structure between the first oxide and the second oxide leads to thereby form a region where respective crystal structures are mutually strained at the interface area between the first oxide and the second oxide. Such a region has a preferable effect on dielectric properties exhibited by the insulator, resulting in an enhancement in the apparent dielectric constant of the dielectric.

Furthermore, as compared with a case where the first oxide and the second oxide do not generate hetero structure, a crystal system is maintained at the interface area between the first oxide and the second oxide, although crystals are strained, and thus defects are hardly caused in the insulator. It is considered that adjacent conductors can be consequently inhibited from being conducted to result in enhancements in dielectric breakdown strength property of the dielectric.

Such effects are further enhanced by a proper combination of the first oxide and the second oxide. For example, the first oxide and the second oxide preferably have the same crystal structure and, in particular, have a perovskite structure to result in further enhancements in the effects. In addition, a combination with the above-mentioned oxide among oxides having a perovskite structure allows for sufficient formation of the region where the respective crystal structures are mutually strained, resulting in further enhancements in the effects.

The effects are not obtained in a conventional grain boundary insulation-type semiconductor capacitor. The reason for this is because a semiconductor particle and a grain boundary phase do not generate hetero structure in a conventional grain boundary insulation-type semiconductor capacitor, as described below.

A representative method for producing a conventional grain boundary insulation-type semiconductor capacitor is as follows. For example, ceramic particles of $SrTiO_3$ or the like are sintered at a high temperature of 1100° C. or more and thereafter heated at a lower temperature than such a sintering temperature in a reducing atmosphere to thereby result in the conversion of the ceramic particles into a semiconductor. The surface of the resulting sintered body is then coated with a compound different in type from the ceramic particles, such as $Bi_2O_3$, for allowing a grain boundary phase to be increased in resistivity, and the resultant is heated at a lower temperature than the temperature at which the ceramic particles are converted into a semiconductor, thereby allowing the compound to be diffused from the surface of the sintered body toward the grain boundary phase.

In the case of production of a grain boundary insulation-type semiconductor capacitor according to the above production method, the grain boundary phase formed by converting the ceramic particles into a semiconductor is considered to be amorphous because the grain boundary phase is formed by liquid phase sintering. That is, no hetero structure is formed. There has been reported a ceramic particle in which a different element for an increase in resistivity is diffused in the order of several tens nanometers and a grain boundary phase high in resistivity is formed. The amount of such a different element diffused, however, is not much more than several percentages in a high-resistivity phase formed by the diffusion. Accordingly, the change in lattice constant of a crystal structure where such a different element is diffused is very small with respect to the lattice constant of a crystal structure where such a different element is not diffused. As a result, no hetero structure is formed.

(4. Modified Example)

While the above embodiment describes the monolayer capacitor where the dielectric is made of a monolayer, as a dielectric element, a multilayer capacitor may be exemplified which has a configuration where dielectrics are stacked.

Figure 3:
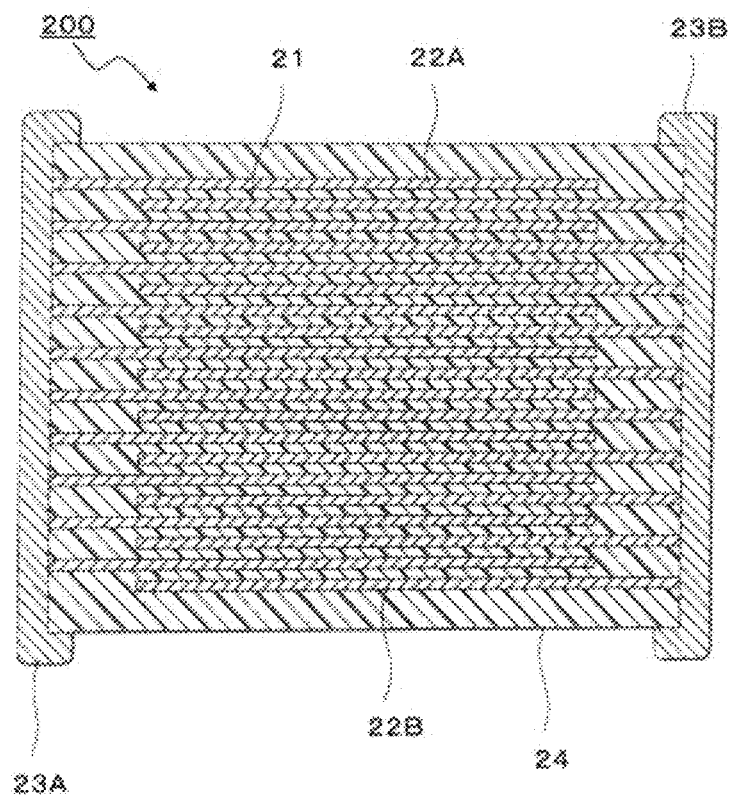
FIG. 3 illustrates a cross-sectional view of a multilayer capacitor as a modified example of the dielectric element according to the present embodiment.

For example, a multilayer capacitor 200 illustrated in FIG. 3 is exemplified as such a multilayer capacitor. The multilayer capacitor 200 has a stacked body 24 where multiple dielectric layers 21 configured from the dielectric having the composite structure and inner electrode layers 22 are alternately stacked. A pair of terminal electrodes 23A and 23B each connected to inner electrode layers 22A and 22B alternately disposed in the stacked body 24 is formed at both terminals of the stacked body 24. The shape of the stacked body 24 is not particularly limited and is usually a rectangular parallelepiped shape. The dimension thereof is also not particularly limited and may be any proper dimension depending on the intended use.

The thickness of one dielectric layer 21 (interlayer thickness) is not particularly limited and can be arbitrarily set depending on desired properties, the intended use and the like. The interlayer thickness is usually preferably about 1 µm to 100 µm. The number of dielectric layers to be stacked is not particularly limited and can be arbitrarily set depending on desired properties, the intended use and the like.

A known method may be used as the method for producing the multilayer capacitor 200 illustrated in FIG. 3 and the stacked body 24 is produced by, for example, producing a green chip to be the stacked body 24 illustrated in FIG. 3, firing the green chip to obtain the stacked body 24, thereafter printing or transferring terminal electrodes on or to the stacked body 24 and baking the resultant. Examples of the method for producing the green chip can include usual printing method and sheet method by use of a paste. Such printing method and sheet method include mixing a powder including a particle having the composite structure with a vehicle where a binder is dissolved in a solvent, to provide a paste, and using the paste to form the green chip.

While embodiments of the present invention are described above, the present invention is not limited to the above embodiments at all and may be modified to various aspects without departing from the scope of the present invention.

EXAMPLES

Hereinafter, the present invention will be described in more detail with reference to Examples and Comparative Examples, but the present invention is not intended to be limited to the following Examples.

First, a powder including a particle having a composite structure was produced as follows. Each powder having a composition and a particle size shown in Tables 1 to 3 was prepared as a powder (first oxide powder) including a first oxide particle (conductor particle) for constituting a conductor region.

Prepared were respective powders of $TiO_2$ (anatase), $Ba(OH)_2 \cdot 8H_2O$, $Al(NO_3)_3$, $Nb(OC_2H_5)_5$, $Sr(OH)_2 \cdot 8H_2O$, $Nb_2O_5$, $Bi(NO_3)_3 \cdot 5H_2O$, KOH, and NaOH as raw materials of a second oxide (insulator) for constituting an insulator region.

Comparative Example 1

Mixed were 1 mmol of a $LaNiO_3$ powder as the first oxide powder and 1 mmol of a $TiO_2$ (anatase) powder as a raw material of the second oxide, thereby obtaining a mixed powder of the first oxide powder and the $TiO_2$ powder. The mixed powder was added to an aqueous $Ba(OH)_2 \cdot 8H_2O$ solution as a raw material of the second oxide, which had a concentration of Ba of 0.12 M and which was prepared so that the Ba/Ti ratio with respect to Ti contained in the mixed powder was 1.0, and the resultant was subjected to an ultrasonic treatment. Thereafter, a hydrothermal synthesis treatment at 180° C. for 3 hours was performed, thereby obtaining a powder including a particle having a composite structure where a conductor region ($LaNiO_3$) was surrounded by an insulator region ($BaTiO_3$).

Example 1

Weighed was 1 mmol of a $RuO_2$ powder as the first oxide powder, and added to an aqueous $Al(NO_3)_3$ solution as a raw material of the second oxide, which was prepared so that the concentration of Al was 0.08 M, and the resultant was subjected to an ultrasonic treatment. Thereafter, a hydrothermal synthesis treatment at 220° C. for 4 hours was performed, thereby obtaining a powder including a particle having a composite structure where a conductor region ($RuO_2$) was surrounded by an insulator region ($Al_2O_3$).

Example 2

Weighed was 1 mmol of a $RuO_2$ powder as the first oxide powder, and added to an ethanol solution of $Nb(OC_2H_5)_5$ as a raw material of the second oxide, which was prepared so that the concentration of Nb was 0.08 M, to provide a mixture, and thereafter the mixture was dried by degassing in vacuum. The mixture dried was added to water to perform a hydrothermal synthesis treatment at 230° C. for 36 hours, thereby obtaining a powder including a particle having a composite structure where a conductor region ($RuO_2$) was surrounded by an insulator region ($Nb_2O_5$).

Example 3

Mixed were 1 mmol of a $RuO_2$ powder as the first oxide powder and 1 mmol of a $TiO_2$ powder as a raw material of the second oxide, thereby obtaining a mixed powder of the first oxide powder and $TiO_2$. The mixed powder was added to an aqueous $Sr(OH)_2 \cdot 8H_2O$ solution as a raw material of the second oxide, which had a concentration of Sr of 0.06 M and which was prepared so that the Sr/Ti ratio with respect to Ti contained in the mixed powder was 3.0 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($RuO_2$) was surrounded by an insulator region ($SrTiO_3$).

Example 4

Mixed were 1 mmol of a $RuO_2$ powder as the first oxide powder and 1 mmol of a $TiO_2$ powder as a raw material of the second oxide, thereby obtaining a mixed powder of the first oxide powder and $TiO_2$. The mixed powder was added to an aqueous $Ba(OH)_2 \cdot 8H_2O$ solution as a raw material of the second oxide, which had a concentration of Ba of 0.06 M and which was prepared so that the Ba/Ti ratio with respect to Ti contained in the mixed powder was 3.0 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($RuO_2$) was surrounded by an insulator region ($BaTiO_3$).

Examples 5 to 8

The same method as in each of Examples 1 to 4 was performed except that the first oxide powder in each of Examples 1 to 4 was changed to an $IrO_2$ powder, thereby obtaining a powder including a particle having a composite structure where a conductor region ($IrO_2$) was surrounded by an insulator region.

Examples 9 to 12

The same method as in each of Examples 1 to 4 was performed except that the first oxide powder in each of Examples 1 to 4 was changed to a $SnO_2$ powder, thereby obtaining a powder including a particle having a composite structure where a conductor region ($SnO_2$) was surrounded by an insulator region.

Examples 13 and 14

The same method as in each of Examples 1 and 2 was performed except that the first oxide powder in each of Examples 1 and 2 was changed to a $LaMnO_3$ powder, thereby obtaining a powder including a particle having a composite structure where a conductor region ($LaMnO_3$) was surrounded by an insulator region.

Examples 15 and 16

The same method as in each of Examples 1 and 2 was performed except that the first oxide powder in each of Examples 1 and 2 was changed to a $LaCoO_3$ powder, thereby obtaining a powder including a particle having a composite structure where a conductor region ($LaCoO_3$) was surrounded by an insulator region.

Examples 17 and 18

The same method as in each of Examples 1 and 2 was performed except that the first oxide powder in each of Examples 1 and 2 was changed to a $LaNiO_3$ powder, thereby obtaining a powder including a particle having a composite structure where a conductor region ($LaNiO_3$) was surrounded by an insulator region.

Examples 19 and 20

The same method as in each of Examples 1 and 2 was performed except that the first oxide powder in each of Examples 1 and 2 was changed to a $SrRuO_3$ powder, thereby obtaining a powder including a particle having a composite structure where a conductor region ($SrRuO_3$) was surrounded by an insulator region.

Example 21

Mixed were 1 mmol of a $LaMnO_3$ powder as the first oxide powder and 0.2 mmol of a $Nb_2O_5$ powder as a raw material of the second oxide, thereby obtaining a mixed powder of the first oxide powder and $Nb_2O_5$. The mixed powder was added to an aqueous KOH solution as a raw material of the second oxide, which had a concentration of K of 1.0 M and which was prepared so that the K/Nb ratio with respect to Nb contained in the mixed powder was 10 at a molar ratio, and a hydrothermal synthesis treatment at 230° C. for 10 hours was performed, thereby obtaining a powder including a particle having a composite structure where a conductor region ($LaMnO_3$) was surrounded by an insulator region ($KNbO_3$).

Examples 22 and 23

The same method as in each of Examples 3 and 4 was performed except that the first oxide powder in each of Examples 3 and 4 was changed to a $LaMnO_3$ powder, thereby obtaining a powder including a particle having a composite structure where a conductor region ($LaMnO_3$) was surrounded by an insulator region.

Example 24

Mixed were 1 mmol of a $LaMnO_3$ powder as the first oxide powder and 0.1 mmol of a $TiO_2$ powder as a raw material of the second oxide, thereby obtaining a mixed powder of the first oxide powder and $TiO_2$. Next, $Bi(NO_3)_3 \cdot 5H_2O$ as a raw material of the second oxide was weighed so that the Bi/Ti ratio was 0.5 at a molar ratio, 50 mL of pure water was added thereto and the resultant was subjected to an ultrasonic treatment, thereby obtaining a solution. Thereafter, KOH as a raw material of the second oxide was added for preparation so that the concentration of the solution was 14.4 M, and the resultant was again subjected to an ultrasonic treatment. The resulting mixed powder was added to the above solution, and a hydrothermal synthesis treatment at 160° C. for 6 hours was performed, thereby obtaining a powder including a particle having a composite structure where a conductor region ($LaMnO_3$) was surrounded by an insulator region (($Bi_{0.5}K_{0.5})TiO_3$).

Example 25

Mixed were 1 mmol of a $LaMnO_3$ powder as the first oxide powder and 0.1 mmol of a $TiO_2$ powder as a raw material of the second oxide, thereby obtaining a mixed powder of the first oxide powder and $TiO_2$. Next, $Bi(NO_3)_3 \cdot 5H_2O$ as a raw material of the second oxide was weighed so that the Bi/Ti ratio was 0.5 at a molar ratio, 50 mL of pure water was added thereto and the resultant was subjected to an ultrasonic treatment, thereby obtaining a solution. Thereafter, NaOH as a raw material of the second oxide was added for preparation so that the concentration of the solution was 14.4 M, and the resultant was again subjected to an ultrasonic treatment. The resulting mixed powder was added to the above solution, and a hydrothermal synthesis treatment at 160° C. for 6 hours was performed, thereby obtaining a powder including a particle having a composite structure where a conductor region ($LaMnO_3$) was surrounded by an insulator region (($Bi_{0.5}Na_{0.5})TiO_3$).

Examples 26 to 30

The same method as in each of Examples 21 to 25 was performed except that the first oxide powder in each of Examples 21 to 25 was changed to a $LaCoO_3$ powder, thereby obtaining a powder including a particle having a composite structure where a conductor region ($LaCoO_3$) was surrounded by an insulator region.

Example 31

The same method as in Example 21 was performed except that the first oxide powder in Example 21 was changed to a $LaNiO_3$ powder, thereby obtaining a powder including a particle having a composite structure where a conductor region ($LaNiO_3$) was surrounded by an insulator region.

Example 32

The same method as in Example 21 was performed except that the first oxide powder in Example 21 was changed to a $SrRuO_3$ powder, thereby obtaining a powder including a particle having a composite structure where a conductor region ($SrRuO_3$) was surrounded by an insulator region.

Example 33

Mixed were 1 mmol of a $La_2NiO_4$ powder as the first oxide powder and 0.1 mmol of a $TiO_2$ powder as a raw material of the second oxide, thereby obtaining a mixed powder of the first oxide powder and $TiO_2$. The mixed powder was added to an aqueous $Sr(OH)_2 \cdot 8H_2O$ solution as a raw material of the second oxide, which had a concentration of Sr of 0.12 M and which was prepared so that the Sr/Ti ratio with respect to Ti contained in the mixed powder was 6.0 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($La_2NiO_4$) was surrounded by an insulator region ($Sr_2TiO_4$).

Example 34

Mixed were 1 mmol of a $La_2NiO_4$ powder as the first oxide powder and 0.1 mmol of a $TiO_2$ powder as a raw material of the second oxide, thereby obtaining a mixed powder of the first oxide powder and $TiO_2$. The mixed powder was added to an aqueous $Sr(OH)_2 \cdot 8H_2O$ solution as a raw material of the second oxide, which had a concentration of Sr of 0.03 M and which was prepared so that the Sr/Ti ratio with respect to Ti contained in the mixed powder was 1.5 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($La_2NiO_4$) was surrounded by an insulator region ($SrTi_2O_5$).

Example 35

Mixed were 1 mmol of a $La_2NiO_4$ powder as the first oxide powder and 0.1 mmol of a $TiO_2$ powder as a raw material of the second oxide, thereby obtaining a mixed powder of the first oxide powder and $TiO_2$. The mixed powder was added to an aqueous $Ba(OH)_2 \cdot 8H_2O$ solution as a raw material of the second oxide, which had a concentration of Ba of 0.12 M and which was prepared so that the Ba/Ti ratio with respect to Ti contained in the mixed powder was 6.0 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($La_2NiO_4$) was surrounded by an insulator region ($Ba_2TiO_4$).

Example 36

Mixed were 1 mmol of a $La_2NiO_4$ powder as the first oxide powder and 0.1 mmol of a $TiO_2$ powder as a raw material of the second oxide, thereby obtaining a mixed powder of the first oxide powder and $TiO_2$. The mixed powder was added to an aqueous $Ba(OH)_2 \cdot 8H_2O$ solution as a raw material of the second oxide, which had a concentration of Ba of 0.03 M and which was prepared so that the Ba/Ti ratio with respect to Ti contained in the mixed powder was 1.5 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($La_2NiO_4$) was surrounded by an insulator region ($BaTi_2O_5$).

Example 37

Mixed were 1 mmol of a $La_2NiO_4$ powder as the first oxide powder and 0.1 mmol of a $TiO_2$ powder as a raw material of the second oxide, thereby obtaining a mixed powder of the first oxide powder and $TiO_2$. The mixed powder was added to an aqueous $Ba(OH)_2 \cdot 8H_2O+Sr(OH)_2 \cdot 8H_2O$ solution as a raw material of the second oxide, which had a concentration of Ba of 0.03 M and a concentration of Sr of 0.03 M, and which was prepared so that the Ba/Sr ratio was 1.0 at a molar ratio and the (Ba+Sr)/Ti ratio with respect to Ti contained in the mixed powder was 3.0 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($La_2NiO_4$) was surrounded by an insulator region (($Ba_{0.5}Sr_{0.5})TiO_3$).

Examples 38 to 42

The same method as in each of Examples 33 to 37 was performed except that the first oxide powder in each of Examples 33 to 37 was changed to a $SrRu_2O_5$ powder, thereby obtaining a powder including a particle having a composite structure where a conductor region ($SrRu_2O_5$) was surrounded by an insulator region.

Examples 43 and 44

The same method as in each of Examples 22 and 23 was performed except that the first oxide powder in each of Examples 22 and 23 was changed to a $LaNiO_3$ powder, thereby obtaining a powder including a particle having a composite structure where a conductor region ($LaNiO_3$) was surrounded by an insulator region.

Example 45

Mixed were 1 mmol of a $LaNiO_3$ powder as the first oxide powder and 0.1 mmol of a $TiO_2$ powder as a raw material of the second oxide, thereby obtaining a mixed powder of the first oxide powder and $TiO_2$. The mixed powder was added to an aqueous $Ba(OH)_2 \cdot 8H_2O+Sr(OH)_2 \cdot 8H_2O$ solution as a raw material of the second oxide, which had a concentration of Ba of 0.03 M and a concentration of Sr of 0.03 M, and which was prepared so that the Ba/Sr ratio was 1.0 at a molar ratio and the (Ba+Sr)/Ti ratio with respect to Ti contained in the mixed powder was 3.0 at a molar ratio, and the resultant was subjected to an ultrasonic treatment. Thereafter, a hydrothermal synthesis treatment at 200° C. for 3 hours was performed, thereby obtaining a powder including a particle having a composite structure where a conductor region ($LaNiO_3$) was surrounded by an insulator region (($Ba_{0.5}Sr_{0.5})TiO_3$).

Examples 46 and 47

The same method as in each of Examples 24 and 25 was performed except that the first oxide powder in each of Examples 24 and 25 was changed to a $LaNiO_3$ powder, thereby obtaining a powder including a particle having a composite structure where a conductor region ($LaNiO_3$) was surrounded by an insulator region.

Examples 48 and 49

The same method as in each of Examples 22 and 23 was performed except that the first oxide powder in each of Examples 22 and 23 was changed to a $SrRuO_3$ powder, thereby obtaining a powder including a particle having a composite structure where a conductor region ($SrRuO_3$) was surrounded by an insulator region.

Example 50

The same method as in Example 45 was performed except that the first oxide powder in Example 45 was changed to a $SrRuO_3$ powder, thereby obtaining a powder including a particle having a composite structure where a conductor region ($SrRuO_3$) was surrounded by an insulator region.

Examples 51 and 52

The same method as in each of Examples 24 and 25 was performed except that the first oxide powder in each of Examples 24 and 25 was changed to a $SrRuO_3$ powder, thereby obtaining a powder including a particle having a composite structure where a conductor region ($SrRuO_3$) was surrounded by an insulator region.

Example 53

Weighed was 1 mmol of a $RuO_2$ powder as the first oxide powder, and added to an aqueous $Al(NO_3)_3$ solution as a raw material of the second oxide, which was prepared so that the concentration of Al was 0.08 M, and the resultant was subjected to an ultrasonic treatment. Thereafter, a hydrothermal synthesis treatment at 220° C. for 1.6 hours was performed, thereby obtaining a powder including a particle having a composite structure where a conductor region ($RuO_2$) was surrounded by an insulator region ($Al_2O_3$).

Example 54

Mixed were 1 mmol of a $LaMnO_3$ powder as the first oxide powder and 1 mmol of a $TiO_2$ powder as a raw material of the second oxide, thereby obtaining a mixed powder of the first oxide powder and TiO$_2$. The mixed powder was added to an aqueous Ba(OH)$_2$·8H$_2$O solution as a raw material of the second oxide, which had a concentration of Ba of 0.06 M and which was prepared so that the Ba/Ti ratio with respect to Ti contained in the mixed powder was 3.0 at a molar ratio, and the resultant was subjected to an ultrasonic treatment. Thereafter, a hydrothermal synthesis treatment at 200° C. for 1.2 hours was performed, thereby obtaining a powder including a particle having a composite structure where a conductor region (LaMnO$_3$) was surrounded by an insulator region (BaTiO$_3$).

Example 55

Mixed were 1 mmol of a La$_2$NiO$_4$ powder as the first oxide powder and 1 mmol of a TiO$_2$ powder as a raw material of the second oxide, thereby obtaining a mixed powder of the first oxide powder and TiO$_2$. The mixed powder was added to an aqueous Ba(OH)$_2$·8H$_2$O solution as a raw material of the second oxide, which had a concentration of Ba of 0.03 M and which was prepared so that the Ba/Ti ratio with respect to Ti contained in the mixed powder was 1.5 at a molar ratio, and the resultant was subjected to an ultrasonic treatment. Thereafter, a hydrothermal synthesis treatment at 200° C. for 1.2 hours was performed, thereby obtaining a powder including a particle having a composite structure where a conductor region (La$_2$NiO$_4$) was surrounded by an insulator region (BaTi$_2$O$_5$).

Example 56

Mixed were 1 mmol of a LaNiO$_3$ powder as the first oxide powder and 1 mmol of a TiO$_2$ powder as a raw material of the second oxide, thereby obtaining a mixed powder of the first oxide powder and TiO$_2$. The mixed powder was added to an aqueous Ba(OH)$_2$·8H$_2$O solution as a raw material of the second oxide, which had a concentration of Ba of 0.06 M and which was prepared so that the Ba/Ti ratio with respect to Ti contained in the mixed powder was 3.0 at a molar ratio, and the resultant was subjected to an ultrasonic treatment. Thereafter, a hydrothermal synthesis treatment at 200° C. for 1.2 hours was performed, thereby obtaining a powder including a particle having a composite structure where a conductor region (LaNiO$_3$) was surrounded by an insulator region (BaTiO$_3$).

It was evaluated whether or not the first oxide and the second oxide formed hetero structure with each other in the composite structure of the particle contained in each of the resulting powders. First, microsampling of the particle was performed according to FIB, and thinning was made, thereby producing a TEM sample. The resulting TEM sample was observed with TEM (JEM-2100F manufactured by JEOL Ltd.), thereby identifying the first oxide particle constituting the conductor region and the grain boundary phase constituting the insulator region in the composite structure.

Figure 4:
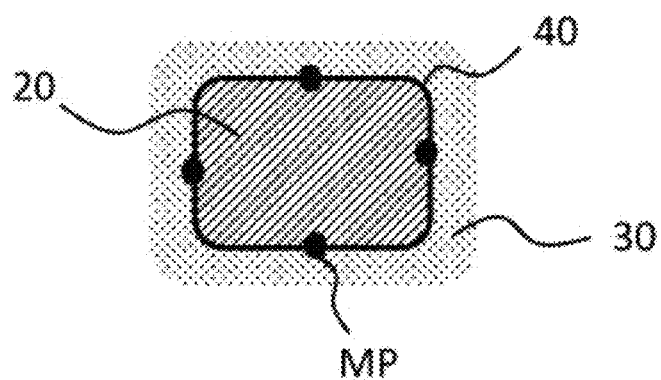
FIG. 4 illustrates an explanatory view of a method of evaluating the presence of hetero structure in Examples of the present invention.

Ten of such particles having the composite structure were selected in the TEM image acquired, and four measurement points MPs different in location by 90° around the interface between the conductor region and the insulator region in each of such particles, as illustrated in FIG. 4, were observed with high-resolution TEM, thereby evaluating whether or not the first oxide and the second oxide formed hetero structure with each other. A case where the number of particles with hetero structure observed at three or more of such four points was seven or more among ten of such particles was evaluated to be a case where the first oxide and the second oxide formed hetero structure with each other in the composite structure. The results are shown in Tables 1 to 3.

Figure 5A:
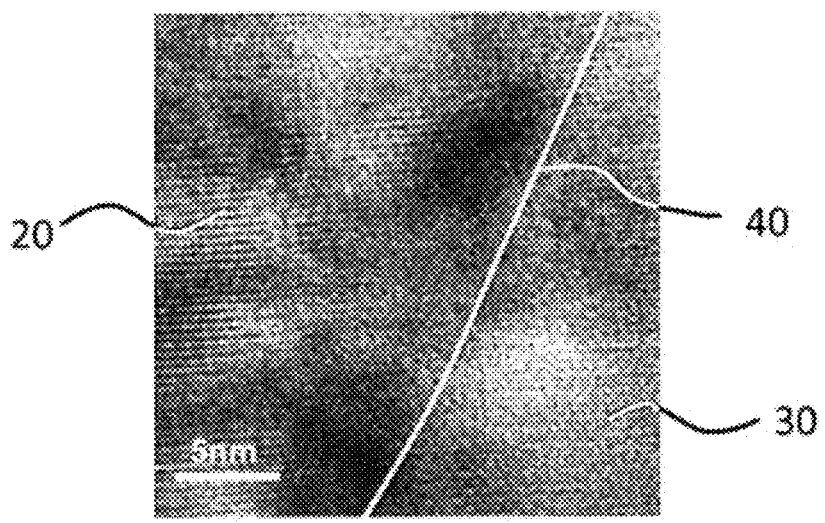
FIG. 5A illustrates a TEM image of a sample according to Example 44 of the present invention.
Figure 6:
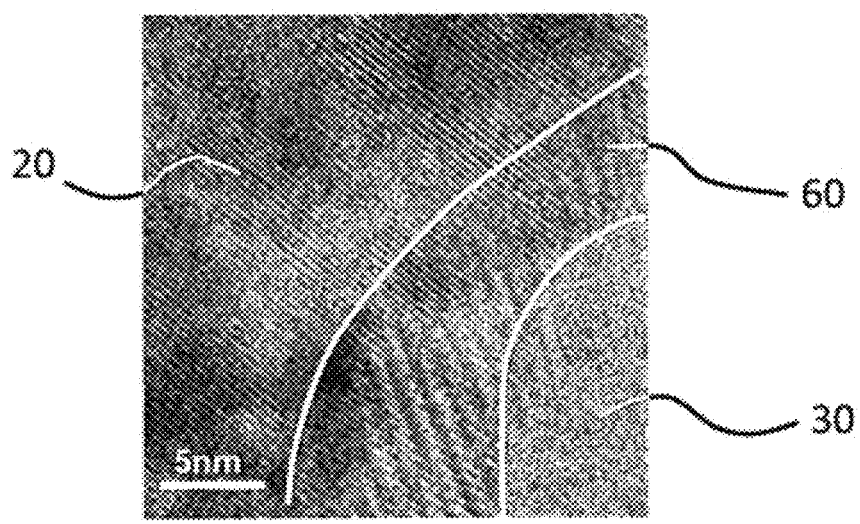
FIG. 6 illustrates a TEM image of a sample according to Comparative Example 1 of the present invention.

FIG. 5A illustrates a TEM image representing hetero structure of the first oxide with the second oxide in the powder of Example 44, and FIG. 6 illustrates a TEM image representing no hetero structure of the first oxide with the second oxide in the powder of Comparative Example 1.

Figure 5B:
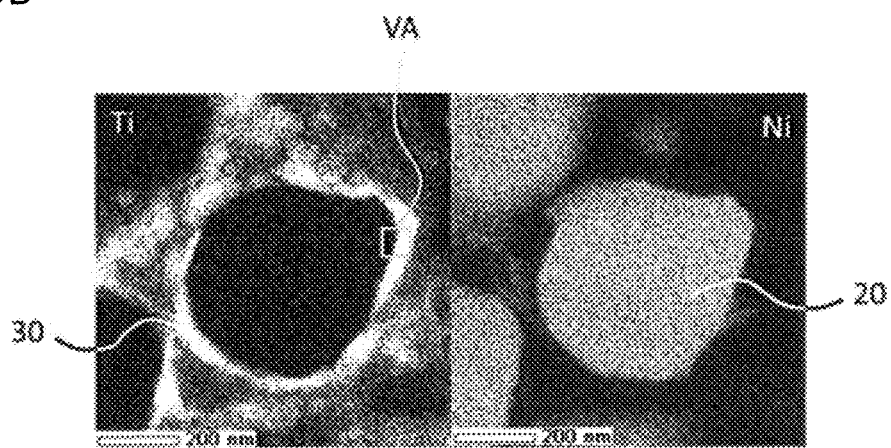
FIG. 5B illustrates mapping images of the sample according to Example 44 of the present invention.

The conductor region and the insulator region were subjected to constituent element mapping according to STEM-EDS analysis. FIG. 5B illustrates mapping images with respect to Example 44. The left in FIG. 5B illustrates a mapping image of a Ti element, and the right in FIG. 5B illustrates a mapping image of a Ni element. While not illustrated, a mapping image of a Ba element was similar to that of a Ti element, and a mapping image of a La element was similar to of a Ni element.

It was further confirmed from the TEM image that the diameter of the conductor region was in the range from 500 to 600 nm and the thickness of the insulator region was in the range from 30 to 50 nm in each sample according to Comparative Example 1 and Examples 1 to 52. It was also confirmed that the diameter of the conductor region was in the range from 200 to 220 nm and the thickness of the insulator region was in the range from 15 to 20 nm in each sample according to Examples 53 to 56.

Each sample according to Comparative Example 1 and Examples 1 to 56 was subjected to measurement and analysis with an XRD measurement apparatus (Smartlab manufactured by Rigaku Corporation) according to an X-ray diffraction method, and it was confirmed that oxide crystals constituting the conductor region and the insulator region contained in each sample according to Comparative Example 1 and Examples 1 to 56 corresponded to substances shown in Table 1.

Examples 1 to 56 and Comparative Example 1

Next, 2% by weight of polyvinyl butyral was added to each of the powders obtained, and subjected to powder compacting, thereby producing each disc-like formed body having a diameter of about 10 mm and a thickness of about 1 mm. The resulting formed body was subjected to removal of the binder at 600° C., and thereafter fired at 1000° C. for 2 hours, thereby obtaining a fired body (dielectric) having a composite structure. Au was sputtered on both main surfaces of the resulting fired body to thereby form an electrode, thereby producing each capacitor of Examples 1 to 56 and Comparative Example 1.

It was evaluated whether or not the first oxide and the second oxide formed hetero structure with each other in the composite structure of the dielectric constituting each of the resulting capacitors. First, microsampling of the dielectric of each of the capacitors was performed according to FIB, and thinning was made, thereby producing a TEM sample. The resulting TEM sample was observed with TEM (JEM-2100F manufactured by JEOL Ltd.), thereby identifying the first oxide particle constituting the conductor region and the grain boundary phase constituting the insulator region in the composite structure.

Ten of such first oxide particles were selected in the TEM image acquired, and four measurement points MPs different in location by 90° around the interface 40 between the conductor particle (conductor region 20) and the grain boundary phase (insulator region 30) in each of such particles, as illustrated in FIG. 4, were observed with high-resolution TEM, thereby evaluating whether or not the first oxide and the second oxide formed hetero structure with each other. A case where the number of particles with hetero structure observed at three or more of such four points was seven or more among ten of such particles was evaluated to be a case where the first oxide and the second oxide formed hetero structure with each other in the composite structure. The results are shown in Tables 1 to 3.

Next, the capacitor was subjected to measurement of the dielectric constant and the dielectric breakdown strength thereof. The dielectric constant (no unit) was calculated from the distance between electrodes, the area of each electrode, and electrostatic capacitance which were measured with a digital LCR meter (4284A manufactured by HP Development Company, L.P.) in conditions of room temperature of 25° C., a frequency of 1 kHz and a level of signal input (measurement voltage) of 1.0 Vrms. A higher dielectric constant is more preferable. In the present Examples, a sample having a dielectric constant of 12000 or more was defined as "Good", a sample having a dielectric constant of 15000 or more was defined as "Particularly Good" and a sample having a dielectric constant of 18000 or more was defined as "Further Good". The results are shown in Tables 1 to 3.

The dielectric breakdown strength is determined by gradually increasing the direct voltage applied between electrodes, dividing the voltage at the occurrence of insulation breakdown by the thickness of the insulator layers and converting the resulting quotient into a value per millimeter. In the present Examples, a sample having an average dielectric breakdown strength of 3.0 kV/mm or more was defined as "Good" and a sample having an average dielectric breakdown strength of 3.5 kV/mm or more was defined as "Particularly Good". The results are shown in Tables 1 to 3.

TABLE 1

| | Powder Composite structure | | | Composite structure | Capacitor Properties | |
|---|---|---|---|---|---|---|
| | Conductor region First oxide particle | | Insulator region | Presence or absence of | Presence or absence of | Dielectric | Dielectric breakdown |
| | Diameter (nm) | Oxide species | Second oxide Oxide species | hetero structure | hetero structure | constant (—) | strength (kV/mm) |
| Comparative Example 1 | 500 | $LaNiO_3$ | $BaTiO_3$ | Absence | Absence | 14000 | 2.5 |
| Example 1 | 500 | $RuO_2$ | $Al_2O_3$ | Presence | Presence | 12000 | 3.2 |
| Example 2 | 500 | $RuO_2$ | $Nb_2O_5$ | Presence | Presence | 12000 | 3.1 |
| Example 3 | 500 | $RuO_2$ | $SrTiO_3$ | Presence | Presence | 14000 | 3.0 |
| Example 4 | 500 | $RuO_2$ | $BaTiO_3$ | Presence | Presence | 14500 | 3.0 |
| Example 5 | 500 | $IrO_2$ | $Al_2O_3$ | Presence | Presence | 12000 | 3.2 |
| Example 6 | 500 | $IrO_2$ | $Nb_2O_5$ | Presence | Presence | 12000 | 3.2 |
| Example 7 | 500 | $IrO_2$ | $SrTiO_3$ | Presence | Presence | 14000 | 3.0 |
| Example 8 | 500 | $IrO_2$ | $BaTiO_3$ | Presence | Presence | 14500 | 3.0 |
| Example 9 | 500 | $SnO_2$ | $Al_2O_3$ | Presence | Presence | 12000 | 3.2 |
| Example 10 | 500 | $SnO_2$ | $Nb_2O_5$ | Presence | Presence | 12000 | 3.2 |
| Example 11 | 500 | $SnO_2$ | $SrTiO_3$ | Presence | Presence | 14000 | 3.0 |
| Example 12 | 500 | $SnO_2$ | $BaTiO_3$ | Presence | Presence | 14500 | 3.0 |
| Example 13 | 500 | $LaMnO_3$ | $Al_2O_3$ | Presence | Presence | 12000 | 3.2 |
| Example 14 | 500 | $LaMnO_3$ | $Nb_2O_5$ | Presence | Presence | 12500 | 3.1 |
| Example 15 | 500 | $LaCoO_3$ | $Al_2O_3$ | Presence | Presence | 12000 | 3.2 |
| Example 16 | 500 | $LaCoO_3$ | $Nb_2O_5$ | Presence | Presence | 12500 | 3.1 |
| Example 17 | 500 | $LaNiO_3$ | $Al_2O_3$ | Presence | Presence | 12000 | 3.2 |
| Example 18 | 500 | $LaNiO_3$ | $Nb_2O_5$ | Presence | Presence | 12500 | 3.1 |
| Example 19 | 500 | $SrRuO_3$ | $Al_2O_3$ | Presence | Presence | 12000 | 3.2 |
| Example 20 | 500 | $SrRuO_3$ | $Nb_2O_5$ | Presence | Presence | 12500 | 3.1 |

TABLE 2

| | Powder Composite structure | | | Composite structure | Capacitor Properties | |
|---|---|---|---|---|---|---|
| | Conductor region First oxide particle | | Insulator region | Presence or absence of | Presence or absence of | Dielectric | Dielectric breakdown |
| | Diameter (nm) | Oxide species | Second oxide Oxide species | hetero structure | hetero structure | constant (—) | strength (kV/mm) |
| Example 21 | 500 | $LaMnO_3$ | $KNbO_3$ | Presence | Presence | 13000 | 3.7 |
| Example 22 | 500 | $LaMnO_3$ | $SrTiO_3$ | Presence | Presence | 14000 | 3.6 |
| Example 23 | 500 | $LaMnO_3$ | $BaTiO_3$ | Presence | Presence | 14500 | 3.5 |
| Example 24 | 500 | $LaMnO_3$ | $(Bi_{0.5}K_{0.5})TiO_3$ | Presence | Presence | 14000 | 3.5 |
| Example 25 | 500 | $LaMnO_3$ | $(Bi_{0.5}Na_{0.5})TiO_3$ | Presence | Presence | 14000 | 3.5 |
| Example 26 | 500 | $LaCoO_3$ | $KNbO_3$ | Presence | Presence | 13000 | 3.7 |
| Example 27 | 500 | $LaCoO_3$ | $SrTiO_3$ | Presence | Presence | 14000 | 3.6 |

TABLE 2-continued

| | Powder Composite structure | | Capacitor | | | |
|---|---|---|---|---|---|---|
| | Conductor region First oxide particle | | Insulator region | Presence or absence of | Composite structure Presence or absence of | Properties | |
| | Diameter (nm) | Oxide species | Second oxide Oxide species | hetero structure | hetero structure | Dielectric constant (—) | Dielectric breakdown strength (kV/mm) |
| Example 28 | 500 | LaCoO$_3$ | BaTiO$_3$ | Presence | Presence | 14500 | 3.5 |
| Example 29 | 500 | LaCoO$_3$ | (Bi$_{0.5}$K$_{0.5}$)TiO$_3$ | Presence | Presence | 14000 | 3.5 |
| Example 30 | 500 | LaCoO$_3$ | (Bi$_{0.5}$Na$_{0.5}$)TiO$_3$ | Presence | Presence | 14000 | 3.5 |
| Example 31 | 500 | LaNiO$_3$ | KNbO$_3$ | Presence | Presence | 13000 | 3.7 |
| Example 32 | 500 | SrRuO$_3$ | KNbO$_3$ | Presence | Presence | 13000 | 3.7 |
| Example 33 | 500 | La$_2$NiO$_4$ | Sr$_2$TiO$_4$ | Presence | Presence | 15200 | 3.3 |
| Example 34 | 500 | La$_2$NiO$_4$ | SrTi$_2$O$_5$ | Presence | Presence | 15700 | 3.1 |
| Example 35 | 500 | La$_2$NiO$_4$ | Ba$_2$TiO$_4$ | Presence | Presence | 16300 | 3.2 |
| Example 36 | 500 | La$_2$NiO$_4$ | BaTi$_2$O$_5$ | Presence | Presence | 17200 | 3.2 |
| Example 37 | 500 | La$_2$NiO$_4$ | (Ba$_{0.5}$Sr$_{0.5}$)TiO$_3$ | Presence | Presence | 16200 | 3.3 |
| Example 38 | 500 | SrRu$_2$O$_5$ | Sr$_2$TiO$_4$ | Presence | Presence | 15300 | 3.1 |
| Example 39 | 500 | SrRu$_2$O$_5$ | SrTi$_2$O$_5$ | Presence | Presence | 15600 | 3.2 |
| Example 40 | 500 | SrRu$_2$O$_5$ | Ba$_2$TiO$_4$ | Presence | Presence | 16600 | 3.4 |
| Example 41 | 500 | SrRu$_2$O$_5$ | BaTi$_2$O$_5$ | Presence | Presence | 17000 | 3.4 |
| Example 42 | 500 | SrRu$_2$O$_5$ | (Ba$_{0.5}$Sr$_{0.5}$)TiO$_3$ | Presence | Presence | 16800 | 3.2 |
| Example 43 | 500 | LaNiO$_3$ | SrTiO$_3$ | Presence | Presence | 18700 | 3.7 |
| Example 44 | 500 | LaNiO$_3$ | BaTiO$_3$ | Presence | Presence | 18900 | 3.5 |
| Example 45 | 500 | LaNiO$_3$ | (Ba$_{0.5}$Sr$_{0.5}$)TiO$_3$ | Presence | Presence | 19000 | 3.6 |
| Example 46 | 500 | LaNiO$_3$ | (Bi$_{0.5}$K$_{0.5}$)TiO$_3$ | Presence | Presence | 18300 | 3.6 |
| Example 47 | 500 | LaNiO$_3$ | (Bi$_{0.5}$Na$_{0.5}$)TiO$_3$ | Presence | Presence | 18200 | 3.6 |
| Example 48 | 500 | SrRuO$_3$ | SrTiO$_3$ | Presence | Presence | 19100 | 3.7 |
| Example 49 | 500 | SrRuO$_3$ | BaTiO$_3$ | Presence | Presence | 19900 | 3.5 |
| Example 50 | 500 | SrRuO$_3$ | (Ba$_{0.5}$Sr$_{0.5}$)TiO$_3$ | Presence | Presence | 19500 | 3.7 |
| Example 51 | 500 | SrRuO$_3$ | (Bi$_{0.5}$K$_{0.5}$)TiO$_3$ | Presence | Presence | 18100 | 3.6 |
| Example 52 | 500 | SrRuO$_3$ | (Bi$_{0.5}$Na$_{0.5}$)TiO$_3$ | Presence | Presence | 18300 | 3.6 |

TABLE 3

| | Powder Composite structure | | | Capacitor | | | |
|---|---|---|---|---|---|---|---|
| | Conductor region First oxide particle | | Insulator region | Presence or absence of | Composite structure Presence or absence of | Properties | |
| | Diameter (nm) | Oxide species | Second oxide Oxide species | hetero structure | hetero structure | Dielectric constant (—) | Dielectric breakdown strength (kV/mm) |
| Example 53 | 200 | RuO$_2$ | Al$_2$O$_3$ | Presence | Presence | 12500 | 3.3 |
| Example 54 | 200 | LaMnO$_3$ | BaTiO$_3$ | Presence | Presence | 14000 | 3.8 |
| Example 55 | 200 | La$_2$NiO$_4$ | BaTi$_2$O$_5$ | Presence | Presence | 16800 | 3.7 |
| Example 56 | 200 | LaNiO$_3$ | BaTiO$_3$ | Presence | Presence | 18000 | 3.7 |

As clear from Tables 1 and 2, and FIGS. 5A and 6, it could be confirmed in comparison of Comparative Example 1 with Example 44 that the first oxide and the second oxide formed hetero structure with each other in the powder according to Example 44. It could also be confirmed that such hetero structure in the powder was also kept in a fired body after firing. As a result, enhancements in apparent dielectric constant and dielectric breakdown strength properties of the capacitor could be confirmed. Even in the case where the first oxide constituting the conductor region and the second oxide constituting the insulator region were various oxides, it could be confirmed that the first oxide and the second oxide were in hetero structure with each other to result in enhancements in apparent dielectric constant and dielectric breakdown strength properties.

Horizontal lattice fringes were continued between the left section (conductor region 20) and the right section (insulator region 30) of the interface 40 in FIG. 5A, and it was thus found that hetero structure is formed between the first oxide and the second oxide. It is noted that a white line representing the interface 40 in FIG. 5A means not the emergence of the interface 40 as a white line in the TEM image, but a line added for clearly indicating the interface 40. On the other hand, lattice fringes were not continued between and were overlapped in the left section (conductor region 20) and the right section (insulator region 30) of the TEM image to cause any unclear section 60 in FIG. 6, and it was thus found that hetero structure of the first oxide and the second oxide was not formed.

FIG. 5A illustrates an enlarged view of a square section VA in FIG. 5B, and it can be seen that neither a Ba element nor a Ti element is present and La and Ni elements are present in the conductor region 20, and neither a La element nor a Ni element is present and Ba and Ti elements are present in the insulator region 30 in FIG. 5B. It could also be confirmed from observation of only peaks attributed to LaNiO$_3$ and BaTiO$_3$ in X-ray diffraction analysis that the oxide constituting the conductor region was LaNiO$_3$ and the oxide constituting the insulator region was BaTiO$_3$.

It could also be confirmed from Table 2 that apparent dielectric constant and dielectric breakdown strength properties were more enhanced in the case where both the first oxide and the second oxide had a perovskite structure. In particular, it could be confirmed that apparent dielectric constant and dielectric breakdown strength properties were still more enhanced in the case where the first oxide and the second oxide were each a predetermined oxide.

It could be confirmed from Table 3 that the same effects were obtained even in the case where the conductor particle constituting the conductor region had a different diameter.

The present invention provides a conductor/insulator composite structure that can allow dielectric breakdown strength property to be enhanced with apparent dielectric constant being kept. A dielectric having such a composite structure is suitable for various electronic equipment, energy storage devices, and the like.

REFERENCE SIGNS LIST

100 . . . monolayer capacitor
10A, 10B . . . terminal electrode
11 . . . dielectric
20 . . . conductor region
30 . . . insulator region
40 . . . interface

What is claimed is:

1. A composite structure comprising a conductor region that is configured from a first oxide, and an insulator region that is configured from a second oxide and that surrounds the conductor region, the first oxide and the second oxide have a perovskite structure, the first oxide is one or more oxides selected from an oxide comprising La and Ni and an oxide comprising Sr and Ru, and the second oxide is an oxide comprising Ti and one or more elements selected from Ba and Sr, wherein an end of the first oxide and an end of the second oxide are continuously bound around an interface between the conductor region and the insulator region, and hetero structure of the first oxide and the second oxide is formed.

2. A fired body comprising the composite structure according to claim 1.

3. A powder comprising a particle having the composite structure according to claim 1.

4. A dielectric element comprising a dielectric having the composite structure according to claim 1.

5. A composite structure comprising a conductor region that is configured from a first oxide, and in insulator region that is configured from a second oxide and that surrounds the conductor region, and the first oxide and the second oxide have a perovskite structure, the first oxide is at least one of LaNiO3 and SrRuO3, and the second oxide is one or more selected from (Ba,Sr)TiO3, (Bi0.5Na0.5)TiO3 and (Bi0.5K0.5)TiO3, wherein an end of the first oxide and an end of the second oxide are continuously bound around an interface between the conductor region and the insulator region, and hetero structure of the first oxide and the second oxide is formed.

6. A fired body comprising the composite structure according to claim 5.

7. A powder comprising a particle having the composite structure according to claim 5.

8. A dielectric element comprising a dielectric having the composite structure according to claim 5.

* * * * *